US010760161B2

(12) United States Patent
Lau et al.

(10) Patent No.: US 10,760,161 B2
(45) Date of Patent: Sep. 1, 2020

(54) INJECT INSERT FOR EPI CHAMBER

(71) Applicant: Applied Materials, Inc., Santa Clara, CA (US)

(72) Inventors: Shu-Kwan Lau, Sunnyvale, CA (US); Mehmet Tugrul Samir, Mountain View, CA (US); Aaron Miller, Sunnyvale, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 916 days.

(21) Appl. No.: 14/584,441

(22) Filed: Dec. 29, 2014

(65) Prior Publication Data

US 2016/0068956 A1   Mar. 10, 2016

Related U.S. Application Data

(60) Provisional application No. 62/046,400, filed on Sep. 5, 2014.

(51) Int. Cl.
| | |
|---|---|
| *C23C 16/455* | (2006.01) |
| *F16L 41/02* | (2006.01) |
| *C30B 25/14* | (2006.01) |
| *C30B 31/16* | (2006.01) |
| *H01J 37/32* | (2006.01) |
| *C30B 25/16* | (2006.01) |

(52) U.S. Cl.
CPC .... *C23C 16/4558* (2013.01); *C23C 16/45563* (2013.01); *C23C 16/45565* (2013.01); *C30B 25/14* (2013.01); *C30B 25/165* (2013.01); *C30B 31/16* (2013.01); *H01J 37/3244* (2013.01)

(58) Field of Classification Search
USPC .............. 118/715–733; 156/345.1–345.55
See application file for complete search history.

(56) References Cited

U.S. PATENT DOCUMENTS

| | | | |
|---|---|---|---|
| 5,551,982 A * | 9/1996 | Anderson | C23C 16/455 118/715 |
| 5,914,050 A | 6/1999 | Comita et al. | |
| 6,099,648 A | 8/2000 | Anderson | |
| 6,143,079 A | 11/2000 | Halpin | |
| 6,576,565 B1 | 6/2003 | Gluschenkov et al. | |
| 6,599,367 B1 | 7/2003 | Nakatsuka et al. | |

(Continued)

FOREIGN PATENT DOCUMENTS

| | | |
|---|---|---|
| CN | 101634014 A | 1/2010 |
| CN | 102549718 A | 7/2012 |

(Continued)

OTHER PUBLICATIONS

International Search Report and Written Opinion of related application PCT/US2015/045068.

*Primary Examiner* — Karla A Moore
*Assistant Examiner* — Tiffany Z Nuckols
(74) *Attorney, Agent, or Firm* — Patterson + Sheridan, LLP

(57) ABSTRACT

Embodiments of the present invention provide a liner assembly including an inject insert. The inject insert enables tenability of flow parameters, such as velocity, density, direction and spatial location, across a substrate being processed. The processing gas across the substrate being processed may be specially tailored for individual processes with a liner assembly according to embodiment of the present invention.

13 Claims, 5 Drawing Sheets

(56) References Cited

U.S. PATENT DOCUMENTS

| | | | |
|---|---|---|---|
| 7,794,667 B2* | 9/2010 | Nishikawa | C23C 16/4409 422/129 |
| 8,980,005 B2* | 3/2015 | Carlson | C23C 16/4404 118/715 |
| 9,768,043 B2 | 9/2017 | Chang et al. | |
| 2001/0050054 A1 | 12/2001 | Kwag et al. | |
| 2002/0025657 A1* | 2/2002 | Anderson | C23C 16/45504 438/478 |
| 2002/0185062 A1 | 12/2002 | Halpin | |
| 2006/0291835 A1 | 12/2006 | Nozaki et al. | |
| 2007/0068456 A1 | 3/2007 | Grimbergen et al. | |
| 2007/0227441 A1 | 10/2007 | Narahara et al. | |
| 2007/0281084 A1* | 12/2007 | Hirosawa | C23C 16/45565 427/248.1 |
| 2008/0017116 A1 | 1/2008 | Campbell et al. | |
| 2008/0178810 A1 | 7/2008 | Koizumi et al. | |
| 2008/0220150 A1* | 9/2008 | Merry | C23C 16/45591 427/8 |
| 2009/0221149 A1 | 9/2009 | Hammond, IV et al. | |
| 2010/0272892 A1* | 10/2010 | Kobayashi | C23C 16/45574 427/255.5 |
| 2011/0174212 A1 | 7/2011 | Ramachandran et al. | |
| 2012/0034786 A1 | 2/2012 | Dhindsa et al. | |
| 2012/0240853 A1* | 9/2012 | Carlson | C23C 16/4404 118/715 |
| 2012/0266819 A1* | 10/2012 | Sanchez | C23C 16/4412 118/719 |
| 2012/0270384 A1 | 10/2012 | Sanchez et al. | |
| 2013/0288460 A1 | 10/2013 | Ranish et al. | |
| 2014/0224174 A1* | 8/2014 | Abedijaberi | C23C 16/45504 118/715 |
| 2014/0224175 A1* | 8/2014 | Abedijaberi | C23C 16/4401 118/719 |
| 2014/0273409 A1* | 9/2014 | Pitney | C23C 16/45578 438/478 |
| 2014/0273410 A1* | 9/2014 | Abedijaberi | H01L 21/02532 438/478 |
| 2015/0292088 A1* | 10/2015 | Canizares | C30B 25/14 438/478 |

FOREIGN PATENT DOCUMENTS

| | | |
|---|---|---|
| CN | 103415910 A | 11/2013 |
| CN | 103430285 A | 12/2013 |
| JP | 2002-075901 A | 3/2002 |
| KR | 10-2012-0030128 A | 3/2012 |
| TW | 201009137 A | 3/2010 |
| TW | 201250052 A | 12/2012 |
| TW | 201419438 A | 5/2014 |
| TW | 201432103 A | 8/2014 |

* cited by examiner

INJECT INSERT FOR EPI CHAMBER

CROSS-REFERENCE TO RELATED APPLICATIONS

This application claims benefit of U.S. provisional patent application Ser. No. 62/046,400, filed Sep. 5, 2014, which is herein incorporated by reference.

BACKGROUND

Field

Embodiments of the present disclosure generally relate to an inject insert for use in semiconductor processing equipment.

Description of the Related Art

Some processes for fabricating semiconductor devices, for example rapid thermal processing, epitaxial deposition, chemical vapor deposition, physical vapor deposition, electron-beam curing, are performed at elevated temperatures. Usually substrates being processed are heated to a desired temperature in a processing chamber by one or more heat sources. The one or more heat source is typically mounted outside the chamber body so that the energy generated by the heat source radiates upon the substrate positioned within the chamber body.

Processing gases are usually supplied to the chamber from a gas inlet, and are kept flowing in the chamber by a pumping system connected to chamber. Gas distribution in a conventional chamber is not uniform across the chamber. For example, gas distribution near the gas inlet is different from gas distribution near the pumping port, and gas distribution near the edge region is different from gas distribution near the center region.

Further, some chambers may include multiple flow zones having different process gases or gas flow rates which feed into a single channel defined within the gas inlet. As a result of the "crosstalk" between the multiple flow zones feeding into a single gas inlet, attempts to tune the gas flow distribution within the processing chamber by varying the type of gas or gas flow rate in the different flow zones have unpredictable tuning results.

Additionally, in operation, localized zones of cyclically flowing gas, known as "recirculation cells," often form within the channels of inject inserts used in conventional gas manifolds. Recirculation cells result in degraded uniformity of the gas flow distribution within the processing chamber, which results in strong variations in epitaxially-grown films.

Continuous rotation has been previously employed in an attempt to resolve some of the above non-uniformity issues. In theory, continuous rotation delivers a majority of the substrate to a variety of flow zones such that flow zone non-uniformity is minimized. Although, continuous rotation of the substrate may reduce the non-uniformity of gas distribution, the rotation alone may not be enough as the requirement for uniformity increases. The foregoing problems attributable to conventional gas inlets are amplified when the flow rate of the process gas is increased, which is desirable to increase the throughput of the CVD device.

Therefore, there is a need for a thermal reactor with improved gas flow distribution.

SUMMARY

Embodiments disclosed herein include an inject insert for use in a semiconductor processing chamber. In one embodiment, an inject insert can include a monolithic body with an inner connecting surface and an exterior surface to connect with a gas delivering device; a plurality of inject ports formed through the monolithic body, each forming an opening in the interior connecting surface and the exterior surface, and a plurality of inject inlets, each of the plurality of inject inlets being connected with at least one of the plurality of inject ports. The plurality of inject ports can create at least a first zone with a first number of inject ports of the plurality of inject ports; a second zone with a second number of inject ports of the plurality of inject ports, the second number of inject ports being different from the first number of inject ports; and a third zone with a third number of inject ports of the plurality of inject ports, the third number of inject ports being different from the first number of inject ports and the second number of inject ports.

In another embodiment, an inject insert can include a monolithic body with an inner connecting surface to connect with a liner body and an exterior surface to connect with a gas delivering device; a plurality of inject ports formed through the monolithic body, each forming an opening in the interior connecting surface and the exterior surface, the plurality of inject ports creating at least; and a plurality of inject inlets, each of the plurality of inject inlets being connected with at least one of the plurality of inject ports, wherein at least a first inlet of the plurality of inject inlets comprises a first width, the first width being greater than an average width.

In another embodiment, a liner assembly can include a liner body comprising an upper liner portion and a lower liner portion, the liner body having a plurality of liner ports formed therein; and an inject insert, the inject insert having a monolithic body with a substantially planar upper surface; a substantially planar lower surface; a curved inner connecting surface to connect with the liner body; an exterior surface to connect with a gas delivering device; and a plurality of inject ports formed therethrough, the plurality of inject ports creating at least a first zone with a first number of passages; a second zone with a second number of passages, the second number of passages being different from the first number of passages; and a third zone with a third number of passages, the third number of passages being different from the first number of passages and the second number of passages; and a plurality of inject inlets connected with at least one of the plurality of inject ports, wherein each of the plurality of inject ports fluidly connect with at least one of the plurality of liner ports through the plurality of inject inlets.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Embodiments disclosed herein describe a liner for use in semiconductor process systems. The inject insert connects with and incorporates at least 6 zones to allow for greater flow control.

Figure 1:
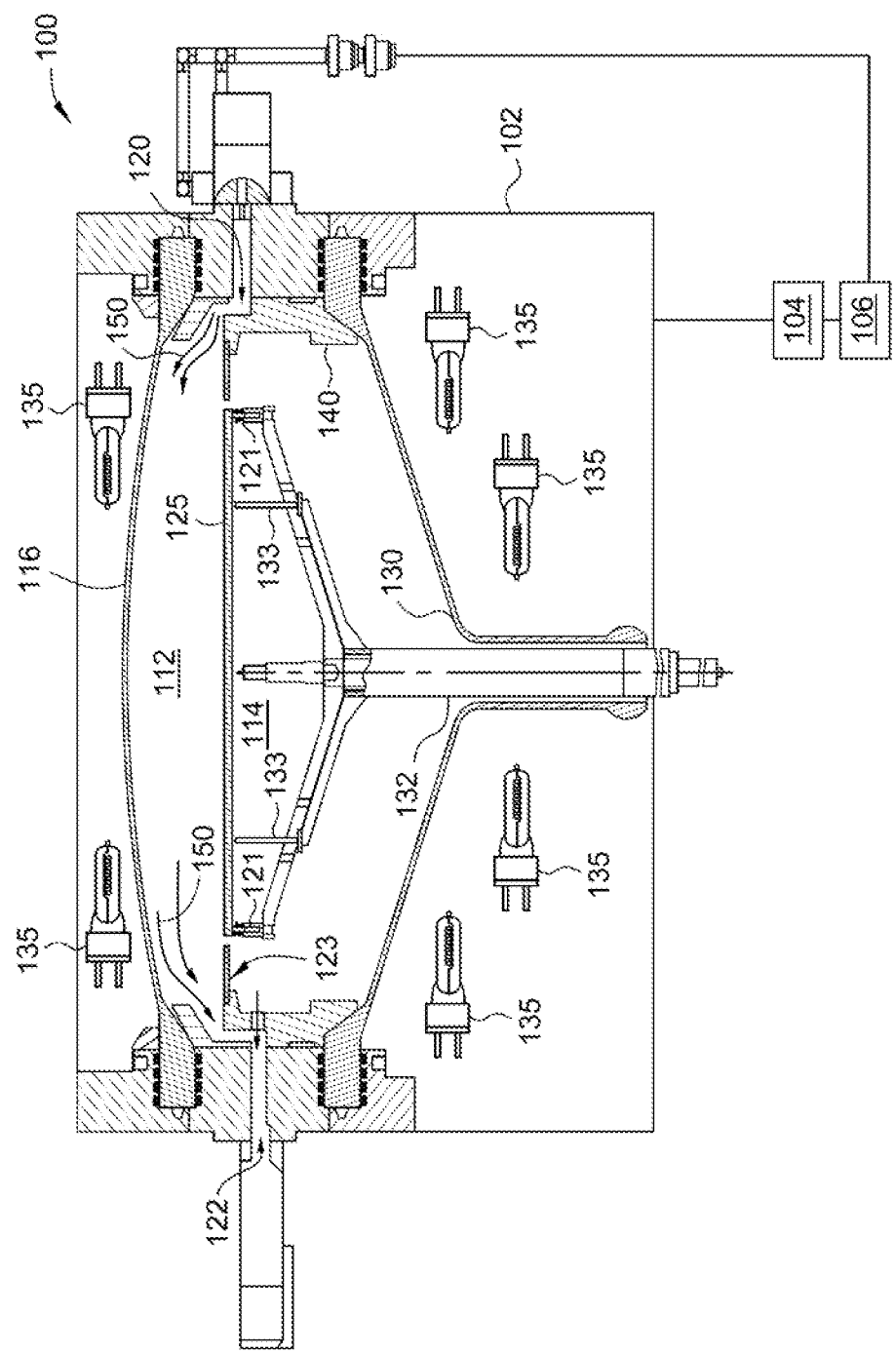
FIG. 1 is a schematic, cross sectional view of a process chamber according to embodiments described herein.

A variety of CVD chambers may be modified to incorporate the embodiments described herein. In one embodiment, the CVD chamber to be modified is the CVD chamber of the EPI CENTURA® CVD System, available from Applied Materials, Inc., of Santa Clara, Calif. The CENTURA® system is a fully automated semiconductor fabrication system, employing a single wafer, multi-chamber, modular design, which accommodates a wide variety of wafer sizes. In addition to the CVD chamber, the multiple chambers may include a pre-clean chamber, a wafer orienter chamber, a cooldown chamber, and a loadlock chamber. The CVD chamber presented herein is shown in schematic in FIG. 1 is one embodiment and is not intended to be limiting of all possible embodiments. It is envisioned that other CVD chambers can be used in accordance with embodiments described herein, including chambers from other manufacturers.

FIG. 1 is a cross sectional view of a processing chamber 100 according to one embodiment. The processing chamber 100 comprises a chamber body 102, support systems 104, and a chamber controller 106. The chamber body 102 includes an upper portion 112 and a lower portion 114. The upper portion 112 includes the area within the chamber body 102 between the upper dome 116 and the substrate 125. The lower portion 114 includes the area within the chamber body 102 between a lower dome 130 and the bottom of the substrate 125. Deposition processes generally occur on the upper surface of the substrate 125 within the upper portion 112. The substrate 125 is supported by support posts 121 disposed beneath the substrate 125. The substrate 125 may be any substrate used in the art for epitaxial deposition, such as a silicon or germanium containing substrate. Further, the substrate may be of varying sizes, such as a 300 mm diameter substrate or a 450 mm diameter substrate.

An upper liner 118 is disposed within the upper portion 112 and is adapted to prevent undesired deposition onto chamber components. The upper liner 118 is positioned adjacent to a ring 123 within the upper portion 112. The processing chamber 100 includes a plurality of heat sources, such as lamps 135, which are adapted to provide thermal energy to components positioned within the processing chamber 100. For example, the lamps 135 may be adapted to provide thermal energy to the substrate 125 and the ring 123. The lower dome 130 may be formed from an optically transparent material, such as quartz, to facilitate the passage of thermal radiation therethrough.

The chamber body 102 includes an inlet 120 and an exhaust port 122 formed therein. The inlet 120 may be adapted to provide a process gas 150 therethrough into the upper portion 112 of the chamber body 102, while an exhaust port 122 may be adapted to exhaust a process gas 150 from the upper portion 112. In such a manner, the process gas 150 may flow parallel to the upper surface of the substrate 125. Thermal decomposition of the process gas 150 onto the substrate 125 to form an epitaxial layer on the substrate 125 is facilitated by the lamps 135.

A substrate support assembly 132 is positioned in the lower portion 114 of the chamber body 102. The substrate support 132 is illustrated supporting a substrate 125 in a processing position. The substrate support assembly 132 includes a plurality of support pins 121 and a plurality of lift pins 133. The lift pins 133 are vertically actuatable and are adapted to contact the underside of the substrate 125 to lift the substrate 125 from a processing position (as shown) to a substrate removal position. The components of the substrate lift assembly 132 can be fabricated from quartz, silicon carbide, graphite coated with silicon carbide or other suitable materials.

The ring 123 can be removably disposed on a lower liner 140 that is coupled to the chamber body 102. The ring 123 can be disposed around the internal volume of the chamber body 102 and circumscribes the substrate 125 while the substrate 125 is in a processing position. The ring 123 can be formed from a thermally-stable material such as silicon carbide, quartz or graphite coated with silicon carbide. The ring 123, in combination with the position of the substrate 125, can separate the volume of the upper portion 112. The ring 123 can provide proper gas flow through the upper portion 112 when the substrate 125 is positioned level with the ring 123. The separate volume of the upper portion 112 enhances deposition uniformity by controlling the flow of process gas as the process gas is provided to the processing chamber 100.

The support system 104 includes components used to execute and monitor pre-determined processes, such as the growth of epitaxial films in the processing chamber 100. The support system 104 includes one or more of gas panels, gas distribution conduits, power supplies, and process control instruments. A chamber controller 106 is coupled to the support system 104 and is adapted to control the processing chamber 100 and support system 104. The chamber controller 106 includes a central processing unit (CPU), a memory, and support circuits. Instructions resident in chamber controller 106 may be executed to control the operation of the processing chamber 100. Processing chamber 100 is adapted to perform one or more film formation or deposition processes therein. For example, a silicon carbide epitaxial growth process may be performed within processing chamber 100. It is contemplated that other processes may be performed within processing chamber 100.

Figure 2A:
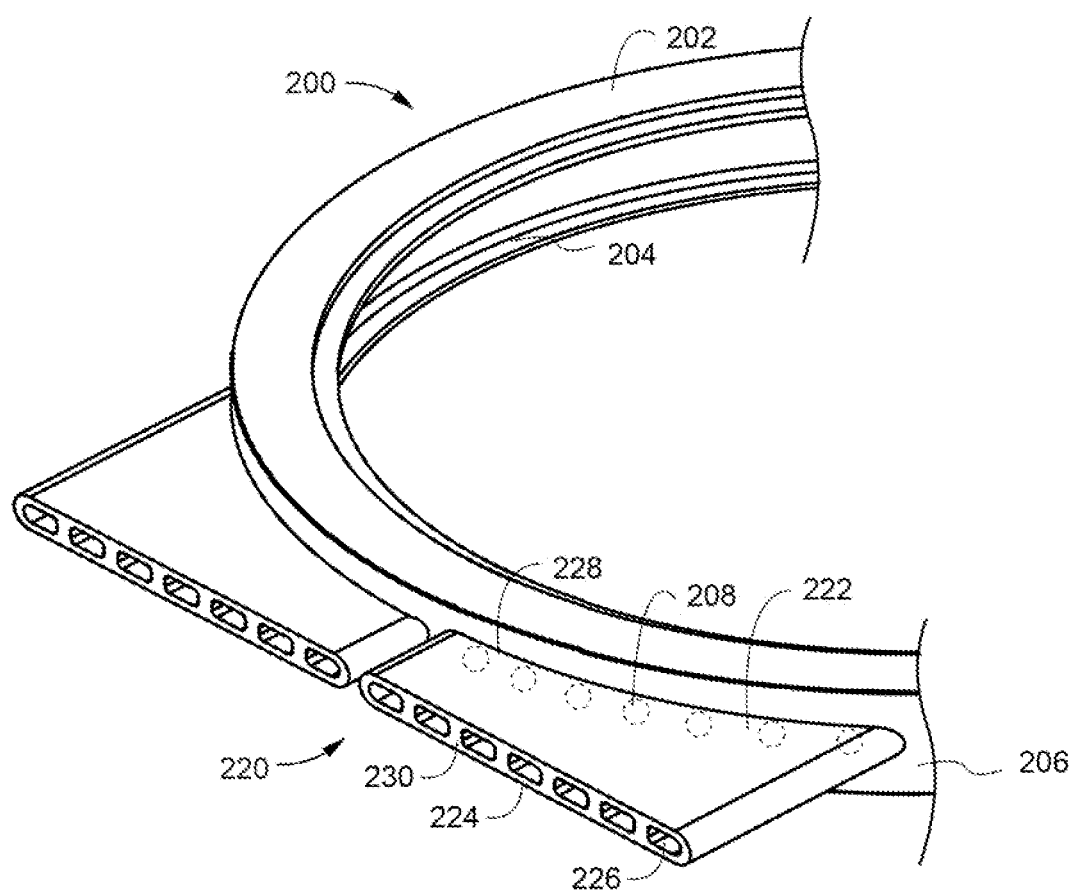
FIG. 2A depicts a schematic diagram of an inject insert in accordance with some embodiments.
Figure 2B:
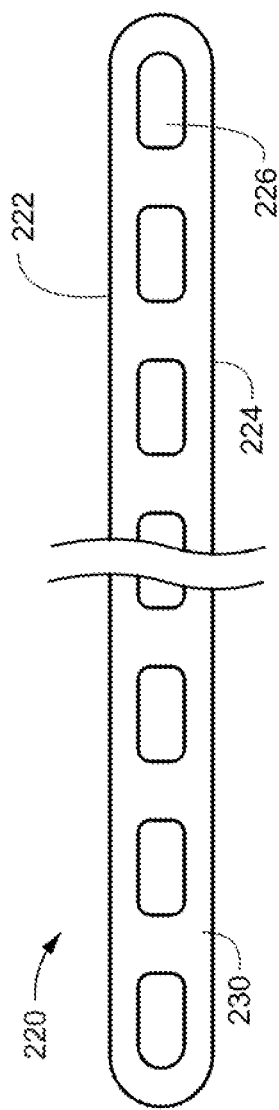
FIG. 2B is a side view of an inject insert according to some embodiments.

FIGS. 2A and 2B depict a liner 200 with an inject insert 220 according to embodiments described herein. FIG. 2A depicts a top view of the inject insert 220 in connection with the liner assembly 200. FIG. 2B depicts a side view of the inject insert 220. The liner assembly 200 includes a liner body 202 with an inner surface 204 and an outer surface 206. The inner surface 204 forms the boundaries of a process region (not shown). A plurality of liner inlets 208, which are depicted as dashed line circles, are formed through the inner surface 204 and outer surface 206 of the liner body 202. The inject insert 220, shown here with two inject inserts 220, is fluidly connected with the plurality of liner inlets 208. Gas supplied from a gas supply source (not shown) is introduced into the process region 206 through the inject insert 220 and then through the plurality of liner inlets 208, whereby the plurality of liner inlets 208 can deliver one or more individual gas flows. The inject insert 220, plurality of liner inlets 208 or both may be configured to provide individual gas flows with varied parameters, such as velocity, density, or composition. The plurality of liner inlets 208 are configured to direct the process gas in a generally radially inward direction, with the gas being delivered to a central area of the process region 206. Each of the plurality of gas inlets 208 and the inject insert 220 may be used, individually or in combination, to adjust one or more parameters, such as velocity, density, direction and location, of the gas from the gas supply source.

The inject insert 220 can be formed from a single piece of metal, ceramic or otherwise inert composition, such as aluminum or quartz. The inject insert 220 can have a substantially planar upper surface 222 and a substantially planar lower surface 224. The inject insert 220 can have a number of inject ports 226 formed therein. The end portions of the inject insert 220 are shown here, with the middle portions omitted for simplicity. In this embodiment, the inject insert 220 is depicted as having seven (7) inject ports 226. The inject ports 226 may be of any shape or size, such that the flow rate, flow velocity and other flow parameters may be controlled. Further, multiple inject ports 226 may connect with any number of the plurality of liner ports 208. In one embodiment, a single port of the plurality of ports 208 is served by more than one of the inject ports 226. In another embodiment, a multiple ports of the plurality of ports 208 is served by a single port of the inject ports 226. The inject insert 220 has a connecting surface 228. The connecting surface 228 may have a surface curvature such that the inject ports 226 penetrating through the inject insert 220 are fluidly sealed to the plurality of liner ports 208. The inject insert 220 may have an exterior surface 230. The exterior surface 230 may be configured to connect to one or more gas lines 301 or other gas delivering device.

The inject ports 226 and the liner ports 208 create at least a first zone, a second zone and a third zone. The first zone has a first number of passages. The second zone has a second number of passages, the second number of passages being different from the first number of passages. The third zone has a third number of passages, the third number of passages being different from the first number of passages and the second number of passages. Larger substrates, due to their increased surface area, require tighter control of process parameters. Thus, by increasing the number of zones, the area that is controlled by a single zone is decreased allowing for finer tuning of process parameters.

Figure 3:
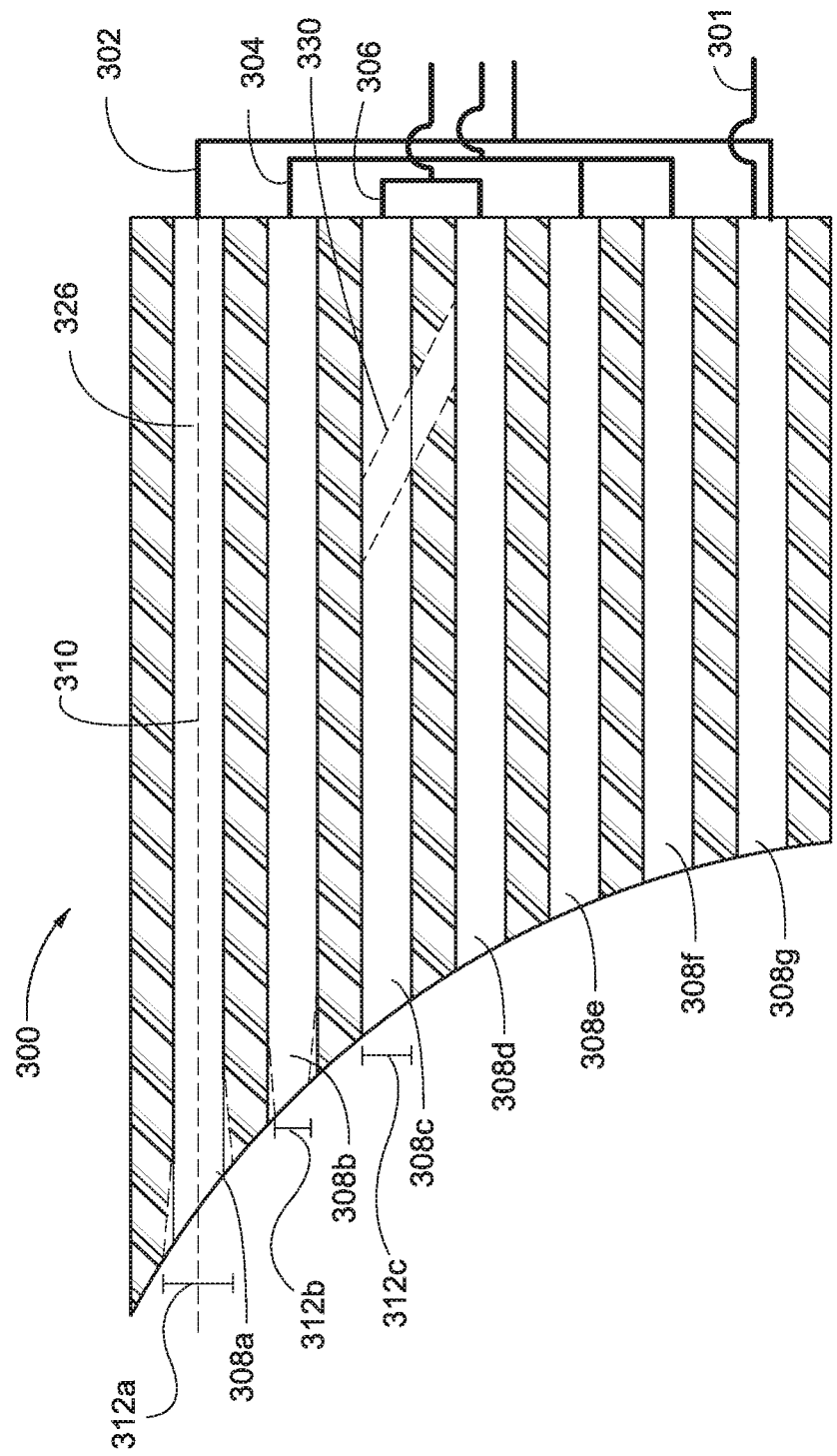
FIG. 3 is a cut away overhead view of an inject insert and gas line combination, according to some embodiments.

FIG. 3 depicts a cutaway overhead view of an inject insert 300, according to one embodiment. The inject insert 300 may have the same or a similar composition to the inject insert 220 described with reference to FIGS. 2A and 2B. The inject insert 300 has a plurality of inject ports 326 formed therein, such as seven inject ports 326. As shown with relation to inject insert 220, the end portions of the inject insert 300 are shown here, with the middle portions omitted for simplicity. The inject insert 300 can have one or more multi-connect gas lines, shown here as first multi-connect gas line 302, second multi-connect gas line 304 and third multi-connect gas line 306. The multi-connect gas lines 302, 304 and 306 are in connection with more than one of the plurality of inject ports 326 (also referred to as the connected ports).

The multi connect gas lines 302, 304 and 306 can deliver either different gases or gases under differing conditions. In one embodiment, the first multi connect gas line 302 delivers a first gas to the connected ports, the second multi connect gas line 304 delivers a second gas to the connected ports and the third multi connect gas line 302 delivers a third gas to the connected ports. The first gas, the second gas and the third gas can be different gases from one another. In another embodiment, the first multi connect gas line 302 delivers a gas to the connected ports at a first pressure and/or a first temperature, the second multi connect gas line 304 delivers a gas to the connected ports at a second pressure and/or a second temperature, and the third multi connect gas line 302 delivers a gas to the connected ports at a third pressure and/or a third temperature. The first pressure, second pressure and the third pressure may be different from one another. As well, the first temperature, second temperature and the third temperature may be different from one another. Further any number of inject ports 326 may be connected to any number of multi-connect gas lines. In further embodiments, the one or more gas lines 301 and/or the multi-connect gas lines 302, 304 and 306 may connect with the same inject port 326.

Though one or more of the inject ports 326 are shown as connected through the one or more gas lines 301 and the multi-connect gas lines 302, 304 and 306, the inject ports 326 may be interconnected within the inject insert 300 such that one or more of the multi-connect gas lines 302, 304 and 306 is unnecessary. In this case, a group of the inject ports 326 can branch internally to the inject insert 300, shown by a branch 330, such that the group of the inject ports 326 receive gas from a single gas line 301.

The inject insert 300 can further include a plurality of inject inlets, shown here as inject inlets 308a-308j. The inject inlets 308a-308j may be approximately equally spaced and positioned in the inject insert 300. The inject inlets 308a-308j may have a varying width such that the inject inlet 308a-308j delivers a differing volume of gas at a proportionally changed velocity. When delivering gas through two inject ports 326 at a standard pressure, an increased width is expected to deliver gas to the process region at a decreased velocity but higher volume than a standard width. Under the same conditions as above, a decreased width is expected to deliver gas to the process region at an increased velocity but lower volume than a standard width.

Shown here, inject inlet 308a has a width 312a which is increased as compared to the width 312c of the inject port 326. Further, the inject inlet 308a has a graded increase, creating the appearance of a cone. Shown here, the increase of the width 312a of the inject inlet 308a results from a graded increase of 5 degrees from a center line 310, as noted by the dashed line extending outward from the related inject port 326. The graded increase may be more or less than 5 degrees. Further, a graded increase is not necessary for the formation of an increased in the width 312a In one embodiment, the width 312a is simply increased at a point prior to the inject inlet 308a forming a slightly larger cylinder in the inject port 326 (not shown).

Though the center line 310 is only described with reference to the inject port 326, it is understood that all bisymmetrical objects or formations as described herein have a center line. Further, though the center line 310 is only shown with relationship to inject inlet 308a, it is understood that each of the inject inlets 308a-308g have a related center line 310 which bisects each of the respective inject ports 326.

In another example, the inject inlet 308b has a width 312b which is decreased as compared to the standard width 312c of the inject ports 326. As above, the inject inlet 308b has a graded decrease, creating the appearance of an inverted cone. Shown here, the decreased width 312b of the inject inlet 308b is formed from a graded decrease of 5 degrees from the center line 310, as noted by the dashed line extending inward from the related inject port 326. The graded decrease may be more or less than 5 degrees.

Though the increased width 312a, the decreased width 312b, and the related graded increase and decrease are shown as symmetrical to the center line 310, this is not intended to be limiting of embodiments described herein. A change in size and shape can be created with full freedom of position and rotation such that the gas can be delivered in any direction and at any angle desired by the end user. Further, the liner inlets 208 of FIGS. 2A and 2B may have a design which either compliments or replicates the designs described with reference to inject inlets 308a-308g.

Figure 4:
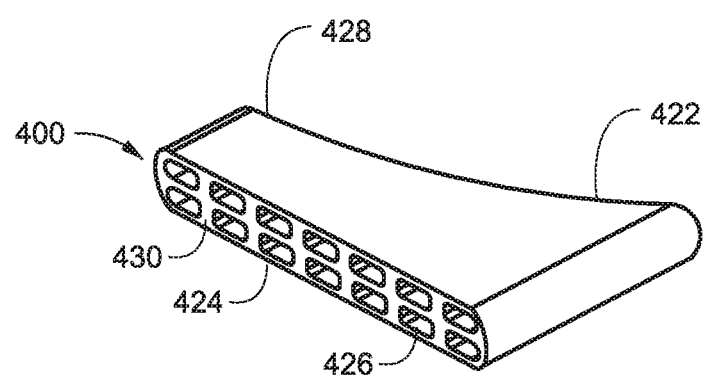
FIG. 4 is a side view of a multi-tier inject insert, according to some embodiments.

FIG. 4 depicts a side view of a multi-tier inject insert 400, according to one embodiment. The multi-tier inject insert 400, shown here with two rows of inject ports 426, can have more than one row of inject ports 426 such that gas can be delivered to the process region more uniformly. As shown with relation to inject insert 220, the end portions of the inject insert 400 are shown here, with the middle portions omitted for simplicity. The multi-tier inject insert 400 can have a substantially planar upper surface 422 and a substantially planar lower surface 424. The multi-tier inject insert 400 can have a number of inject ports 426 formed therein per row. In this embodiment, the multi-tier inject insert 400 is depicted as having fourteen (14) inject ports 426. In this embodiment, the number or shape of each of the inject ports 426 used in each of the corresponding rows may be of varying shapes, sizes and positions.

Further, multiple inject ports 426 may connect with any number of the plurality of inject inlets (not shown). The inject inlets described with reference to FIG. 4 are substantially similar to the inject inlets 308 described with reference to FIG. 3. The multi-tier inject insert 400 has a connecting surface 428. The connecting surface 428 may have a surface curvature such that the inject ports 426 penetrating through the multi-tier inject insert 400 are fluidly sealed to the upper liner 118 and the lower liner (not shown). The multi-tier inject insert 400 has an exterior surface 430 which may be configured to connect to a gas line as described in FIG. 3.

Tight control of both chemistry and gas flow is required for current and next generation semiconductor devices. Using the embodiments described above, control of both of the delivery of gas to the inject ports and flow of the gas from the inject ports through the inject inlets can be increased, leading to an increased control of process parameters for a majority of the substrate. Increased control of process parameters, including control of the velocity of the gases delivered to the chamber and the subsequent zone formation, will lead to improved epitaxial deposition and reduced product waste among other benefits.

While the foregoing is directed to embodiments of the disclosed devices, methods and systems, other and further embodiments of the disclosed devices, methods and systems may be devised without departing from the basic scope thereof, and the scope thereof is determined by the claims that follow.

What is claimed is:

1. An inject insert, comprising:
   a monolithic body with an inner connecting surface configured to connect with a liner body, and an exterior connecting surface configured to connect with a gas delivering device, the inner connecting surface opposite the exterior connecting surface, the monolithic body having:
      a plurality of inject ports formed through the monolithic body and parallel to a first plane, each inject port forming an opening in the inner connecting surface and the exterior connecting surface and having a constant width portion, and each injection port has a centerline that extends in a single direction from the inner connecting surface to the exterior connecting surface, the plurality of inject ports creating at least:
         a first zone with a first number of inject ports of the plurality of inject ports;
         a second zone with a second number of inject ports of the plurality of inject ports, the second number of inject ports being different from the first number of inject ports; and
         a third zone with a third number of inject ports of the plurality of inject ports, the third number of inject ports being different from the first number of inject ports and the second number of inject ports; and
      a plurality of inject inlets, each of the plurality of inject inlets being connected with at least one of the plurality of inject ports, wherein at least a first inlet of the plurality of inject inlets is positioned at the outer edge of the plurality of inject inlets and comprises a first width, the first width being greater than an average width of the plurality of inject inlets; and
      a branch formed between at least two of the plurality of inject ports, within the monolithic body, and wherein the branch is formed upstream of the plurality of inject inlets.

2. The inject insert of claim 1, wherein the first inlet has a graded increase to the first width.

3. The inject insert of claim 1, further comprising a second inlet of the plurality of inject inlets comprises a second width, the second width being less than the average width.

4. The inject insert of claim 1, wherein the monolithic body comprises quartz.

5. The inject insert of claim 1, wherein there is more than one row of inject ports in the plurality of inject ports.

6. The inject insert of claim 1, wherein the plurality of inject ports comprises seven or more inject ports.

7. The injection insert of claim 1, wherein
   a width of the inject inlets in the first zone is configured to achieve a first velocity of a gas during processing,
   a width of the inject inlets in the second zone is configured to achieve a second velocity of a gas during processing, and
   a width of the inject inlets in the third zone is configured to achieve a third velocity of a gas during processing.

8. An inject insert, comprising:
   a monolithic body with an inner connecting surface configured to connect with a liner body, and an exterior connecting surface configured to connect with a gas delivering device, the inner connecting surface opposite the exterior connecting surface, the monolithic body having:
      a plurality of inject ports formed through the monolithic body and parallel to a first plane, each inject port forming an opening in the inner connecting surface and the exterior connecting surface and having a constant width portion, and each injection port has a centerline that extends in a single direction from the inner connecting surface to the exterior connecting surface, the plurality of inject ports creating at least:
         a first zone with a first number of inject ports of the plurality of inject ports;
         a second zone with a second number of inject ports of the plurality of inject ports, the second number of inject ports being different from the first number of inject ports; and a third zone with a third number of inject ports of the plurality of inject ports, the third number of inject ports being different from the first number of inject ports and the second number of inject ports; and a plurality of inject inlets, each of the plurality of inject inlets being connected with at least one of the plurality of inject ports, wherein at least a first inlet of the plurality of inject inlets is positioned at the outer edge of the plurality of inject inlets, connects to a first inject port of the plurality of inject ports, and comprises a first width, the first width being greater than the constant width portion of the first inject port; and a branch formed between at least two of the plurality of inject ports, within the monolithic body, and wherein the branch is formed upstream of the plurality of inject inlets.

9. The inject insert of claim 8, wherein the first inlet has a graded increase to the first width.

10. The inject insert of claim 8, further comprising a second inlet of the plurality of inject inlets that has a second width and connects to a second inject port of the plurality of inject ports, the second width being less than the constant width portion of the second inject port.

11. The inject insert of claim 8, wherein the monolithic body comprises quartz.

12. The inject insert of claim 8, wherein there is more than one row of inject ports in the plurality of inject ports.

13. The injection insert of claim 8, wherein a width of the inject inlets in the first zone is configured to achieve a first velocity of a gas during processing, a width of the inject inlets in the second zone is configured to achieve a second velocity of a gas during processing, and a width of the inject inlets in the third zone is configured to achieve a third velocity of a gas during processing.

* * * * *